US006441501B1

United States Patent
Tseng et al.

(10) Patent No.: US 6,441,501 B1
(45) Date of Patent: Aug. 27, 2002

(54) WIRE-BONDED SEMICONDUCTOR DEVICE WITH IMPROVED WIRE ARRANGEMENT SCHEME FOR MINIMIZING ABNORMAL WIRE SWEEP

(75) Inventors: Charles Tseng, Taichung; Chin-Te Chen, Miaoli Hsien; Yu-Ting Lai, Taichung; Chung-Pao Wang, Taichung, all of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/678,184

(22) Filed: Sep. 30, 2000

(51) Int. Cl.⁷ .................. H01L 23/52; H01L 23/48; H01L 23/28; H01L 23/02; H01L 25/00
(52) U.S. Cl. .................. 257/784; 257/776; 257/786; 257/692; 257/693; 257/666; 228/180.5
(58) Field of Search .................. 257/786, 784, 257/776, 775, 783, 666, 676; 228/180.5

(56) References Cited

U.S. PATENT DOCUMENTS

| | | | | |
|---|---|---|---|---|
| 5,359,227 A | * | 10/1994 | Liang et al. | 257/784 |
| 5,362,984 A | * | 11/1994 | Konda et al. | 257/776 |
| 5,625,235 A | * | 4/1997 | Takiar | 257/776 |
| 5,684,332 A | | 11/1997 | Chen et al. | 257/286 |
| 5,780,772 A | | 7/1998 | Singh et al. | 361/813 |
| 6,031,281 A | | 2/2000 | Kang et al. | 257/784 |
| 6,169,331 B1 | * | 1/2001 | Manning et al. | 257/684 |

FOREIGN PATENT DOCUMENTS

| | | | |
|---|---|---|---|
| JP | 61-43436 | * | 3/1986 |
| JP | 6-84991 | * | 3/1994 |
| JP | 10-56036 | * | 2/1998 |
| JP | 11-142420 | * | 5/1999 |
| JP | 2000-100854 | * | 4/2000 |

* cited by examiner

Primary Examiner—Alexander O. Williams
(74) Attorney, Agent, or Firm—Peter F. Corless; Steven M. Jensen; Edwards & Angell, LLP

(57) ABSTRACT

A wire-bonded semiconductor device with an improved wire-arrangement scheme is proposed, which can help minimize abnormal wire sweep during encapsulation process. Among the bonding wires on the semiconductor device, those located in corners would be mostly susceptible to abnormal wire sweep, particularly a high-loop bonding wire that is located in immediate adjacency to a low-loop bonding wire located in one corner of the wire-bonded semiconductor device. To solve this problem, the low-loop bonding wire that is located in immediate adjacency to the sweep-susceptible high-loop bonding wire is erected substantially to the same loop height as the high-loop bonding wire, so that it can serve as a shield to the sweep-susceptible high-loop bonding wire against the flow of injected resin during encapsulation process, thus preventing abnormal wire sweep. Alternatively, if a pair of low-loop bonding wires are located in immediate adjacency to the sweep-susceptible high-loop bonding wire and are bonded to a common double-wire bond pad, these two low-loop bonding wires are arranged in an intercrossed manner, which can also help reduce the impact of the injected resin on the sweep-susceptible high-loop bonding wire, thus preventing abnormal wire sweep. The prevention of abnormal wire sweep allows the finished semiconductor device to be more assured in quality and reliability.

4 Claims, 6 Drawing Sheets

WIRE-BONDED SEMICONDUCTOR DEVICE WITH IMPROVED WIRE ARRANGEMENT SCHEME FOR MINIMIZING ABNORMAL WIRE SWEEP

BACKGROUND OF THE INVENTION

1. Field of the Invention

This invention relates to semiconductor packaging technology, and more particularly, to a wire-bonded semiconductor device with an improved wire-arrangement scheme that can help minimize abnormal wire sweep due to the bonding wires being shoved by the flow of injected resin during encapsulation process.

2. Description of Related Art

A semiconductor chip is typically enclosed in a protective package before it is mounted on a circuit board. Various types of semiconductor packaging technologies are presently utilized in the semiconductor industry. The wire bond technology is widely utilized to electrically couple the semiconductor chip by means of a plurality of bonding wires to a substrate on which the semiconductor chip is mounted.

As semiconductor devices are made smaller and smaller, the wire-bonding process is becoming more critical since the bonding wires are also proportionally reduced to very small sizes and pitches. During encapsulation process, however, such small and densified bonding wires would be easily shoved by the flow of the injected encapsulation material, such as resin, and would consequently be displaced sideways toward adjacent wires. This sideward displacement in the bonding wires is customarily referred to as abnormal wire sweep. The problem of abnormal wire sweep is illustratively depicted in the following with reference to FIG. 1, FIG. 2, and FIGS. 3A–3B.

FIG. 1 is a schematic diagram showing the encapsulation of a wire-bonded semiconductor device 10. As shown, the wire-bonded semiconductor device 10 is substantially qaudrilaterally-shaped having four corners 10a, 10b, 10c, 10d. During the encapsulation process, the wire-bonded semiconductor device 10 is mounted inside an encapsulation mold 40, with the corner 10a thereof being aligned to the resin inlet gate 41 from which an encapsulation material, typically resin, is injected in liquid state (as indicated by the arrows in FIG. 1) onto the wire-bonded semiconductor device 10.

In the case of FIG. 1, the problem of abnormal wire sweep would likely occur in the nearby corners 10b, 10d located in immediate adjacency to the resin-receiving corner 10a. The cause of this problem is depicted below.

FIG. 2 is a schematic diagram showing the wire arrangement in the corner 10b of the wire-bonded semiconductor device 10 shown in FIG. 1. As shown, the wire-bonded semiconductor device 10 includes a semiconductor chip 11 and a substrate 20 on which the semiconductor chip 11 is mounted. The semiconductor chip 11 is formed with a plurality of bond pads 12 (hereinafter referred to as "chip-side bond pads") on the periphery thereof; and correspondingly, the substrate 20 is formed with a plurality of bond pads 21 (hereinafter referred to as "substrate-side bond pads") on the top surface thereof. A set of bonding wires 30 are interconnected between the chip-side bond pads 12 and the substrate-side bond pads 21 for electrically coupling the semiconductor chip 11 to the substrate 20.

The bonding wire set 30 includes two subsets: a first wire subset 31 and a second wire subset 32. The first wire subset 31 includes a number of bonding wires (only three are shown in FIG. 2, respectively designated by the reference numerals 31a, 31b, 31c), which are located along one side of the wire-bonded semiconductor device 10 adjoining the corner 10b. The second wire subset 32 includes a number of bonding wires, for example a pair of bonding wires 32a, 32b, which are located in the corner 10b of the wire-bonded semiconductor device 10 and in immediate adjacency to the first wire subset 31.

The bonding wires 31a, 31b, 31c in the first wire subset 31 are typically functional wires, such as signal and power wires; whereas the bonding wires 32a, 32b in the second wire subset 32 are typically non-functional bonding wires, such as grounding wires (G/W).

Referring further to FIGS. 3A–3B, the first wire subset 31 and the second wire subset 32 are wired in such a manner as to extend from the chip-side bond pads 12 along a looped trajectory down to the substrate-side bond pads 21. To allow high wire pitch, the bonding wires 31a, 31b, 31c in the first wire subset 31 are all set to a large loop height of $H_1$ as illustrated in FIG. 3A; while the bonding wires 32a, 32b in the second wire subset 32 are all set to a small loop height of $H_2$, where $H_2<H_1$, as illustrated in FIG. 3B (in this specification, the term "loop height" refers to the vertical distance from the top surface of the semiconductor chip 11 to the highest point of the bonding wire).

Referring back to FIG. 2, since the bonding wires 31a, 31b, 31c in the first wire subset 31 are greater in loop height than the bonding wires 32a, 32b in the second wire subset 32, the foremost bonding wire 31a in the first wire subset 31 located in immediate adjacency to the first wire subset 31 would face directly against the flow of injected resin (not shown) and thus would likely be shoved to displace sideways toward the neighboring bonding wire 31b. This sideward wire displacement is customarily referred to as abnormal wire sweep, which may easily cause the foremost bonding wire 31a in the first wire subset 31 to be short-circuited to the neighboring bonding wire 31b.

A variety of patented semiconductor fabrication technologies have been proposed as a solution to the problem of abnormal wire sweep. A few of these patented technologies are listed in the following:

U.S. Pat. No. 6,031,281 entitled "SEMICONDUCTOR INTEGRATED CIRCUIT DEVICE HAVING DUMMY BONDING WIRES";

U.S. Pat. No. 5,780,772 entitled "SOLUTION TO MOLD WIRE SWEEP IN FINE PITCH DEVICES";

U.S. Pat. No. 5,684,332 entitled "METHOD OF PACKAGING A SEMICONDUCTOR DEVICE WITH MINIMUM BONDING PAD PITCH AND PACKAGING DEVICE THEREFROM".

These patented technologies solve the problem of abnormal wire sweep by providing dummy wires among the bonding wires. One drawback to the provision of dummy wires, however, is that it would make the wire-bonding process significantly more complex to implement.

SUMMARY OF THE INVENTION

It is therefore an objective of this invention to provide a wire-bonded semiconductor device with an improved wire-arrangement scheme that can help minimize abnormal wire sweep without using dummy wires.

In accordance with the foregoing and other objectives, the invention proposes a wire-bonded semiconductor device with an improved wire-arrangement scheme.

In one preferred embodiment, the wire-bonded semiconductor device of the invention comprises: (a) a substrate having a plurality of bond pads; (b) a semiconductor chip mounted on the substrate, the semiconductor chip having a plurality of bond pads; and (c) a set of bonding wires interconnected between the chip-side bond pads and the substrate-side bond pads for electrically coupling the semiconductor chip to the substrate; the bonding wire set including: (c1) a first wire subset arranged along one side of the wire-bonded semiconductor device and erected to a first loop height; and (c2) a second wire subset arranged in adjacency to the first wire subset in a corner of the wire-bonded semiconductor device; the second wire subset including a number of bonding wires, with the one located in immediate adjacency to the first wire subset being erected to the first loop height, and every other one being erected to a second loop height smaller than the first loop height.

In another preferred embodiment, the wire-bonded semiconductor device of the invention comprises: (a) a substrate having a plurality of bond pads including at least one double-wire bond pad; (b) a semiconductor chip mounted on the substrate, the semiconductor chip having a plurality of bond pads; and (c) a set of bonding wires interconnected between the chip-side bond pads and the substrate-side bond pads for electrically coupling the semiconductor chip to the substrate; the bonding wire set including: (c1) a first wire subset arranged along one side of the wire-bonded semiconductor device and erected to a first loop height; and (c2) a second wire subset arranged in adjacency to the first wire subset in a corner of the wire-bonded semiconductor device and erected to a second loop height smaller than the first loop height; the second wire subset including at least a pair of bonding wires arranged in immediate adjacency to the first wire subset and bonded together to the double-wire bond pad on the substrate in an intercrossed manner.

The invention can help minimize abnormal wire sweep in the corner-located bonding wires that would otherwise make the corner-located bonding wires to be likely short-circuited to each other. This benefit allows the finished semiconductor device to be more assured in quality and reliability.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments representing two solutions to the above-mentioned problem of abnormal wire sweep are disclosed in full details in the following with reference to FIG. 4, FIGS. 5A–5C, FIG. 6, and FIGS. 7A–7B.

First Preferred Embodiment

(FIG. 4 and FIGS. 5A–5C)

The first preferred embodiment of the invention is disclosed in full details in the following with reference to FIG. 4 and FIGS. 5A–5C.

Figure 1:
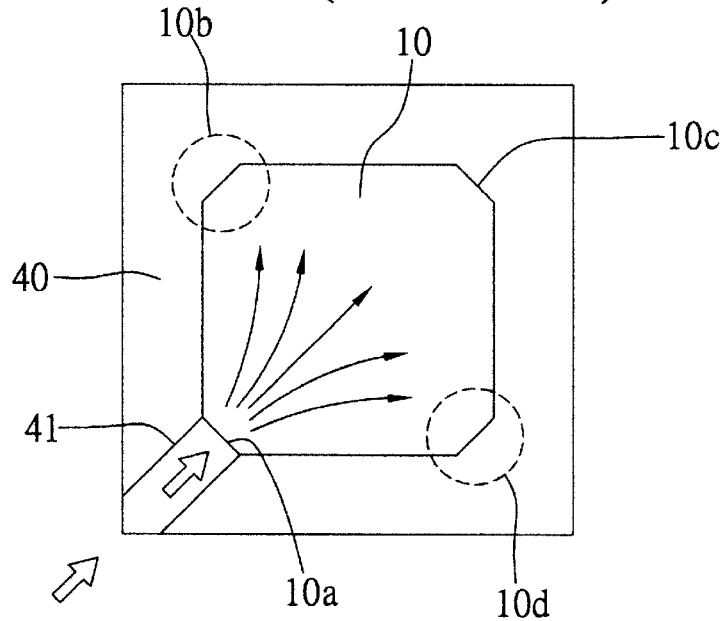
FIG. 1 (PRIOR ART) is a schematic diagram showing the encapsulation of a wire-bonded semiconductor device.
Figure 2:
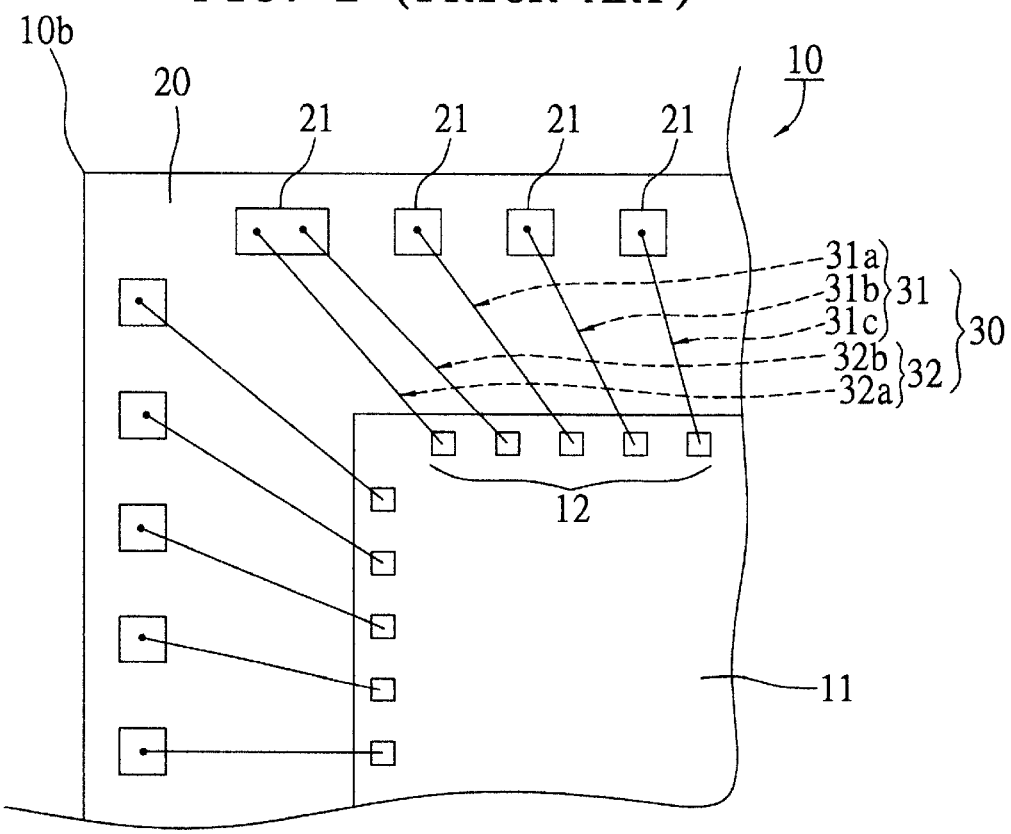
FIG. 2 (PRIOR ART) is a schematic diagram showing the wire arrangement around a corner of the wire-bonded semiconductor device shown in FIG. 1.
Figure 3A:
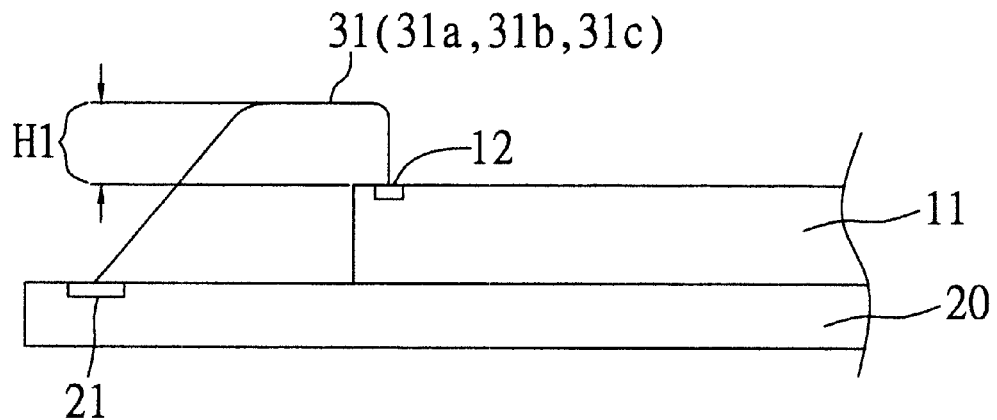
FIGS. 3A–3B (PRIOR ART) are schematic sectional diagrams used to illustrate the various loop heights of respective bonding wires in the wire-bonded semiconductor device of FIG. 2.
Figure 3B:
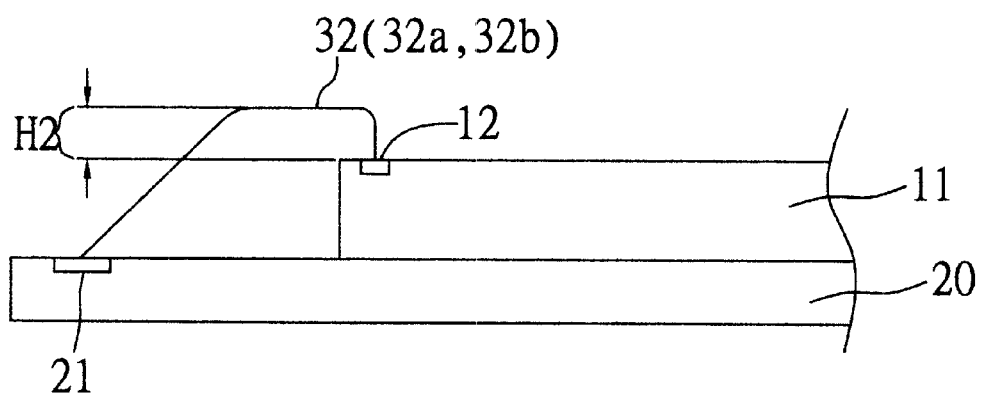
Figure 4:
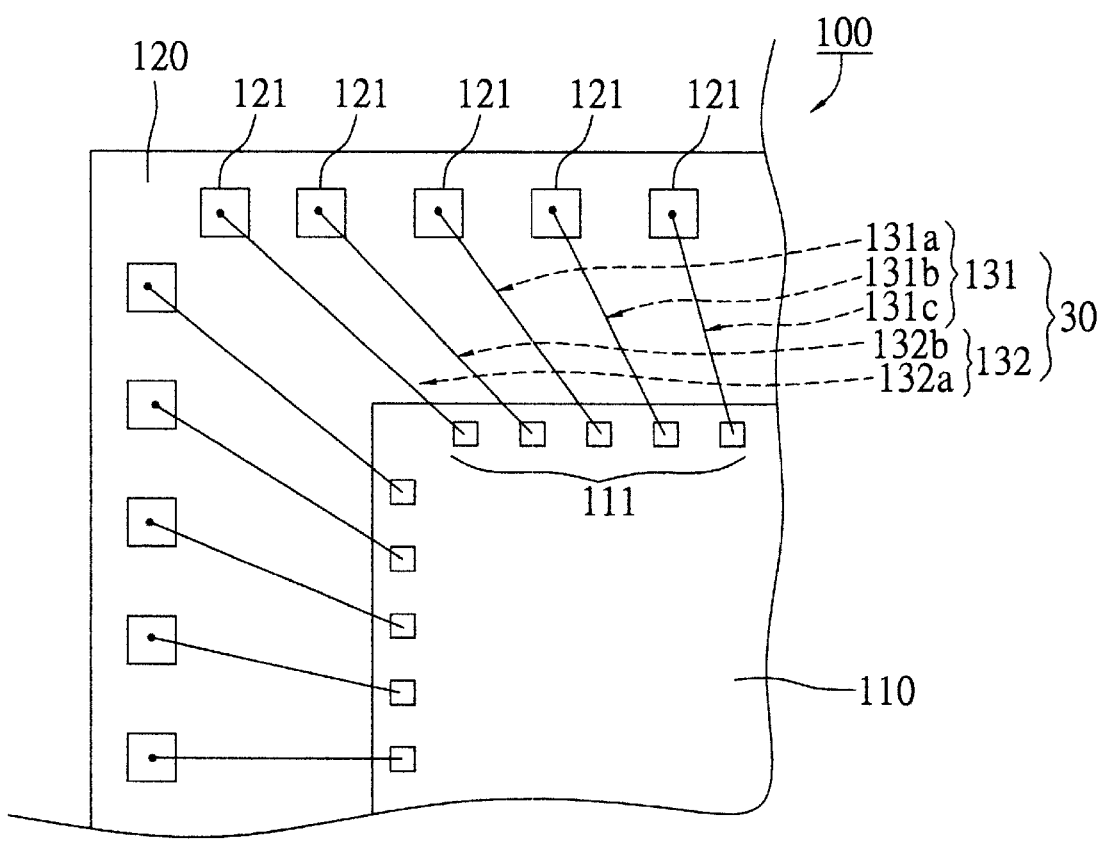
FIG. 4 shows a schematic top view of a wire-bonded semiconductor device with an improved wire-arrangement scheme according to the first preferred embodiment of the invention.

FIG. 4 shows a schematic top view of a wire-bonded semiconductor device 100 with an improved wire-arrangement scheme according to the first preferred embodiment of the invention for minimizing abnormal wire sweep.

As shown, this wire-bonded semiconductor device 100 comprises a semiconductor chip 110 and a substrate 120 on which the semiconductor chip 110 is mounted. The semiconductor chip 110 is formed with a plurality of bond pads 111 (hereinafter referred to as chip-side bond pads) on the periphery thereof, and correspondingly, the substrate 120 is formed with a plurality of bond pads 121 (hereinafter referred to as substrate-side bond pads) on the top surface thereof. A set of bonding wires 130 are interconnected between the chip-side bond pads 111 and the substrate-side bond pads 121 for electrically coupling the semiconductor chip 110 to the substrate 120.

The bonding wire set 130 include a first wire subset 131 and a second wire subset 132. The first wire subset 131 includes a number of bonding wires (only three are shown in FIG. 4, respectively designated by the reference numerals 131a, 131b, 131c), which are located along one side of the semiconductor chip 110. The second wire subset 132 includes a number of bonding wires, for example a pair of bonding wires 132a, 132b, which are located in immediate adjacency to the first wire subset 131.

Figure 5A:
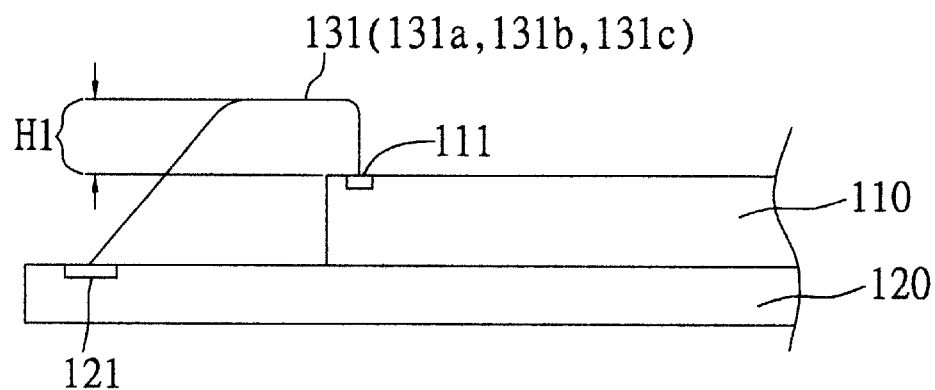
FIGS. 5A–5C are schematic sectional diagrams used to illustrate the various loop heights of respective bonding wires in the wire-bonded semiconductor device of FIG. 4.
Figure 5B:
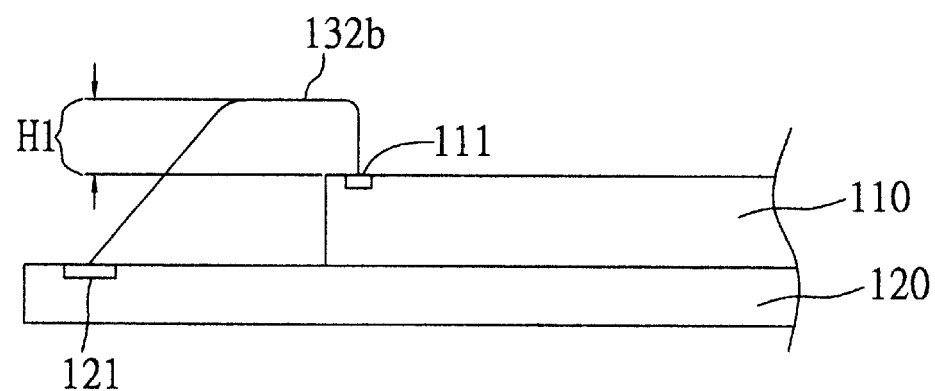
Figure 5C:
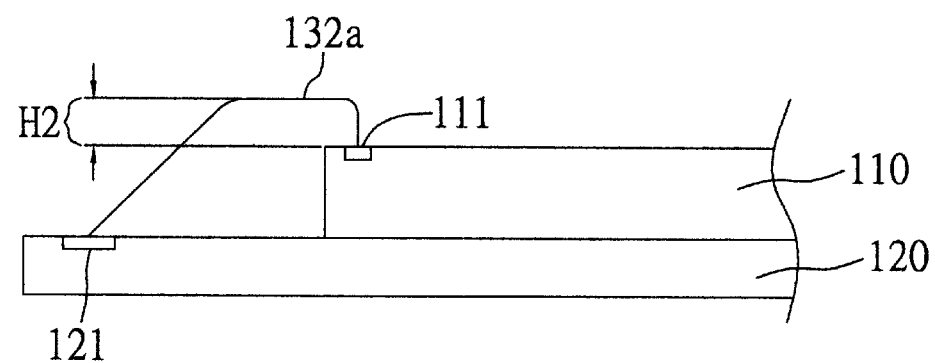

Referring further to FIGS. 5A–5C, the first wire subset 131 and the second wire subset 132 are wired in such a manner as to extend from the chip-side bond pads 111 along a looped trajectory to the substrate-side bond pads 121.

As shown in FIG. 5A, similar to the prior art, all the bonding wires 131a, 131b, 131c in the first wire subset 131 are set to a large loop height of $H_1$.

As shown in FIG. 5B, it is a characteristic feature of the invention that the second bonding wire 132b in the second wire subset 132, which is located in immediate adjacency to the first wire subset 131, is also set to the large loop height of $H_1$.

As shown in FIG. 5C, similar to the prior art, the first bonding wire 132a in the second wire subset 132 is set to a small loop height of $H_2$, where $H_2 < H_1$.

From FIGS. 5A–5C, it can be seen that the first preferred embodiment of the invention differs from the prior art only in that the second bonding wire 132b in the second wire subset 132, which is located in immediate adjacency to the first wire subset 131, is elevated from $H_2$ to $H_1$ so that it is substantially leveled with the foremost bonding wire 131a in the first wire subset 131. This elevated arrangement allows the second bonding wire 132b in the second wire subset 132 to serve as a shield to the foremost bonding wire 131a in the first wire subset 131 against the flow of injected resin (not shown), thus preventing the foremost bonding wire 131a in the first wire subset 131 from abnormal wire sweep.

Second Preferred Embodiment

Figure 6:
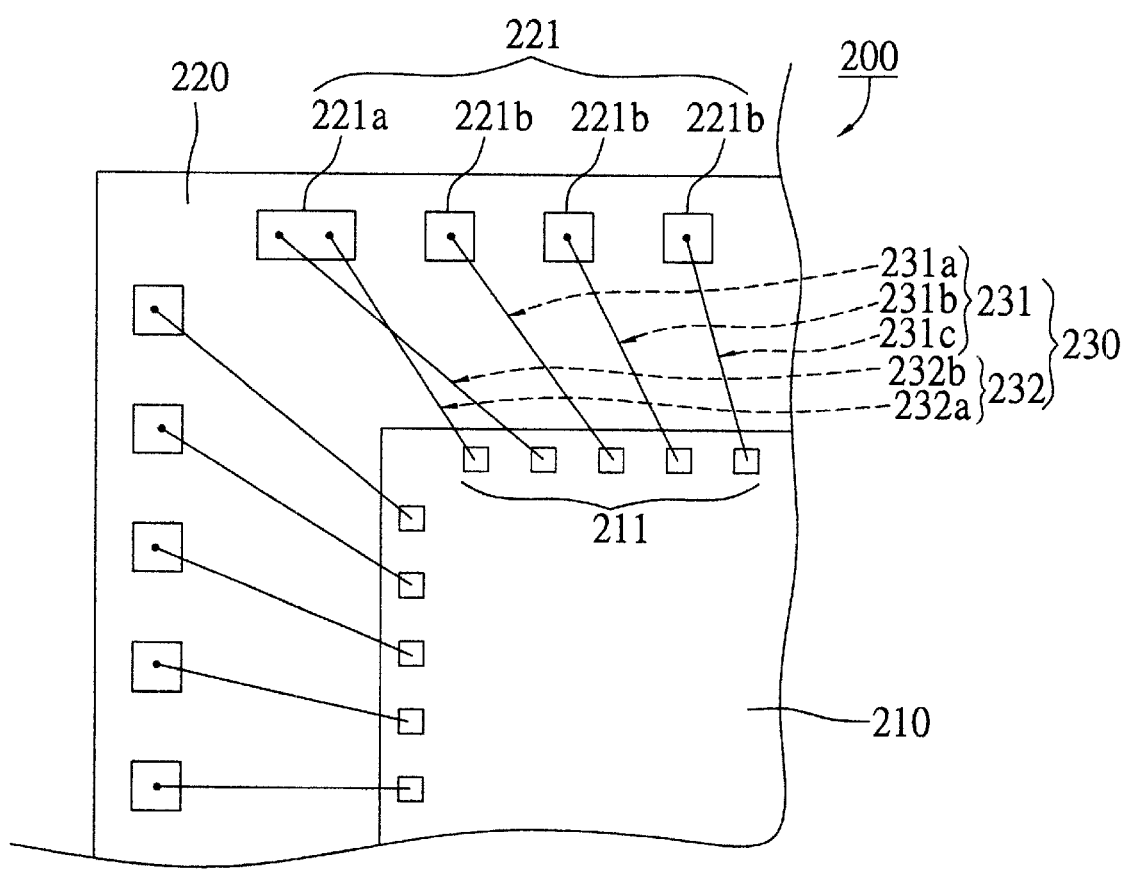
FIG. 6 shows a schematic top view of a wire-bonded semiconductor device with an improved wire-arrangement scheme according to the second preferred embodiment of the invention.
Figure 7A:
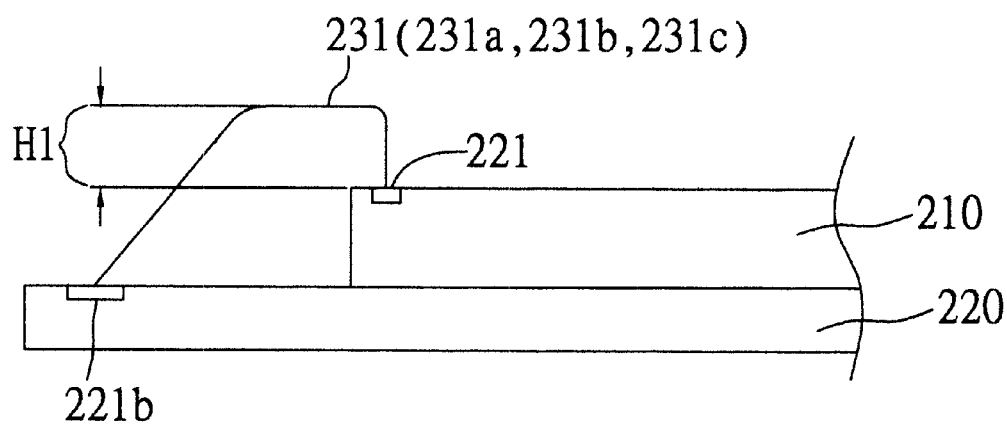
FIGS. 7A–7B are schematic sectional diagrams used to illustrate the various loop heights of respective bonding wires in the wire-bonded semiconductor device of FIG. 6.
Figure 7B:
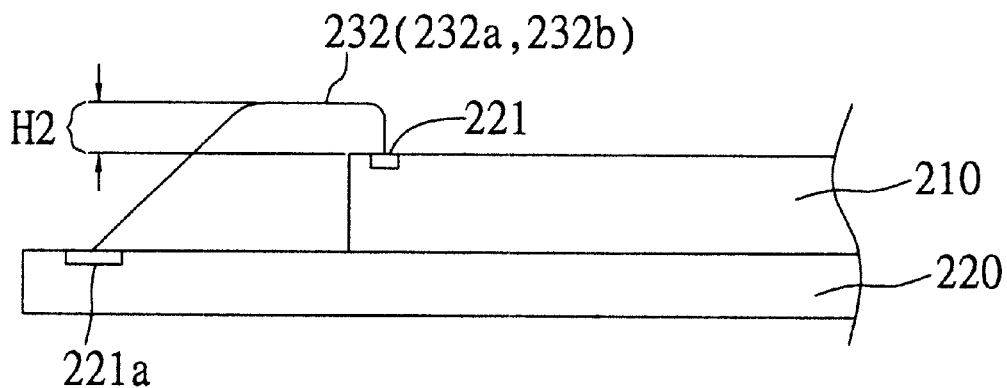

(FIG. 6 and FIGS. 7A–7B)

The second preferred embodiment of the invention is disclosed in full details in the following with reference to FIG. 6 and FIGS. 7A–7B.

FIG. 6 shows a schematic top view of a wire-bonded semiconductor device 200 with an improved wire-arrangement scheme according to the second preferred embodiment of the invention for minimizing abnormal wire sweep.

As shown, this wire-bonded semiconductor device 200 comprises a semiconductor chip 210 and a substrate 220 on which the semiconductor chip 210 is mounted. The semiconductor chip 210 is formed with a plurality of bond pads 211 (hereinafter referred to as chip-side bond pads) on the periphery thereof; and correspondingly, the substrate 220 is formed with a set of bond pads 221 (hereinafter referred to as substrate-side bond pads) on the top surface thereof.

This wire-bonded semiconductor device 200 differs from the one shown in FIG. 4 particularly in that the substrate-side bond pad set 221 includes a double-wire bond pad 221a and a number of single-wire bond pads 221b.

A set of bonding wires 230 are interconnected between the chip-side bond pads 211 and the substrate-side bond pads 221 for electrically coupling the chip 210 to the substrate 220. The bonding wire set 230 include a first wire subset 231 and a second wire subset 232. The first wire subset 231 includes a number of bonding wires (only three are shown in FIG. 6, respectively designated by the reference numerals 231a, 231b, 231c), which are located along one side of the chip 210. The second wire subset 232 includes a number of bonding wires, for example a pair of bonding wires 232a, 232b, which are located in immediate adjacency to the first wire subset 231.

In this wire-bonded semiconductor device 200, the two bonding wires 232a, 232b in the second wire subset 232 are bonded together to the double-wire bond pad 221a. These two bonding wires 232a, 232b are used to serve, for example, as ground wires (G/W).

Referring further to FIGS. 7A–7B, the first wire subset 231 and the second wire subset 232 are wired in such a manner as to extend from the chip-side bond pads 211 along a looped trajectory to the substrate-side bond pads 221.

As shown in FIG. 7A, similar to the prior art, all the bonding wires 231a, 231b, 231c in the first wire subset 231 are set to a large loop height of $H_1$.

As shown in FIG. 7B, similar to the prior art, the two bonding wires 232a, 232b in the second wire subset 232 are all set to a small loop height of $H_2$, where $H_2 < H_1$.

Referring back to FIG. 6, it is a characteristic feature of the invention that the two bonding wires 232a, 232b in the second wire subset 232, which are wired to the double-wire bond pad 211a and located in immediate adjacency to the first wire subset 231, are arranged in an intercrossed manner. This intercrossed arrangement can help reduce the impact of the injected resin on the foremost bonding wire 231a in the first wire subset 231 located in immediate adjacency to these two intercrossed bonding wires 232a, 232b, thus preventing the foremost bonding wire 231a in the first wire subset 231 from abnormal wire sweep.

In conclusion, the invention provides a wire-bonded semiconductor device with an improved wire-arrangement scheme which can help minimize abnormal wire sweep in the corner-located bonding wires that would otherwise make the corner-located bonding wires to be short-circuited to each other. This benefit allows the finished semiconductor device to be more assured in quality and reliability.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A wire-bonded semiconductor device, which comprises:
   (a) a substrate having a plurality of bond pads including at least one double-wire bond pad;
   (b) a semiconductor chip mounted on the substrate; the semiconductor chip having a plurality of bond pads; and
   (c) a set of bonding wires interconnected between the chip-side bond pads and the substrate-side bond pads for electrically coupling the semiconductor chip to the substrate; the bonding wire set including:
      (c1) a first wire subset arranged along one side of the wire-bonded semiconductor device and erected to a first loop height;
      (c2) a second wire subset arranged in adjacency to the first wire subset in a corner of the wire-bonded semiconductor device and erected to a second loop height smaller than the first loop height; the second wire subset including at least a pair of bonding wires located in immediate adjacency to the first wire subset and bonded together to the double-wire bond pad on the substrate in an intercrossed manner.

2. The wire-bonded semiconductor device of claim 1, wherein the intercrossed pair of bonding wires in the second wire subset are ground wires.

3. A wire-bonded semiconductor device, which comprises:
   (a) a substrate having a plurality of bond pads including at least one double-wire bond pad;
   (b) a semiconductor chip mounted on the substrate; the semiconductor chip having a plurality of bond pads; and
   (c) a set of bonding wires interconnected between the chip-side bond pads and the substrate-side bond pads for electrically coupling the semiconductor chip to the substrate; the bonding wire set including:
      (c1) a first wire subset arranged along a first side of the wire-bonded semiconductor device adjoining a first corner, the first wire subset being erected to a first loop height;
      (c2) a second wire subset located in the first corner of the wire-bonded semiconductor device and in immediate adjacency to the first wire subset; the second wire subset including a number of bonding wires; wherein the one located in immediate adjacency to the first wire subset is erected to the first loop height, with every other one being erected to a second loop height smaller than the first loop height;
      (c3) a third wire subset located along a second side of the wire-bonded semiconductor device adjoining a second corner; the third wire subset being erected to the first loop height; and
      (c4) a fourth wire subset located in the second corner of the wire-bonded semiconductor device and in immediate adjacency to the third wire subset and erected to the second loop height; the second wire subset including at least a pair of bonding wires located in immediate adjacency to the third wire subset and bonded together to the double-wire bond pad on the substrate in an intercrossed manner.

4. The wire-bonded semiconductor device of claim 3, wherein the intercrossed pair of bonding wires in the second wire subset are ground wires.

* * * * *